US012666693B2

(12) United States Patent
Hsiung et al.

(10) Patent No.: US 12,666,693 B2
(45) Date of Patent: Jun. 23, 2026

(54) METHOD OF MANUFACTURING A SEMICONDUCTOR DEVICE HAVING A DUMBBELL-SHAPED CONTACT CONNECTING DIFFERENTLY RECESSED SOURCE/DRAIN EPITAXIAL LAYERS

(71) Applicant: TAIWAN SEMICONDUCTOR MANUFACTURING COMPANY, LTD., Hsinchu (TW)

(72) Inventors: Te-Chih Hsiung, Taipei City (TW); Yun-Hua Chen, Zhubei City (TW); Yang-Cheng Wu, Hsinchu City (TW); Sheng-Hsun Fu, Hsinchu County (TW); Wen-Kuo Hsieh, Taipei City (TW); Chih-Yuan Ting, Taipei City (TW); Huan-Just Lin, Hsinchu City (TW); Bing-Sian Wu, Hsinchu City (TW); Yi-Hsuan Chiu, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 527 days.

(21) Appl. No.: 18/116,713

(22) Filed: Mar. 2, 2023

(65) Prior Publication Data

US 2024/0170339 A1     May 23, 2024

Related U.S. Application Data

(60) Provisional application No. 63/427,733, filed on Nov. 23, 2022.

(51) Int. Cl.
*H10D 84/01*      (2026.01)
*H10D 30/01*      (2025.01)
(Continued)

(52) U.S. Cl.
CPC ......... *H10D 84/017* (2025.01); *H10D 30/024* (2025.01); *H10D 30/6211* (2025.01);
(Continued)

(58) Field of Classification Search
CPC ........ H10D 84/0165–0195; H10D 84/85–859; H10D 62/151; H10D 62/021;
(Continued)

(56) References Cited

U.S. PATENT DOCUMENTS

2016/0087053 A1*   3/2016   Kim ..................... H10D 30/797
                                                257/369
2016/0284697 A1*   9/2016   Yoon .................... H10D 84/038
(Continued)

FOREIGN PATENT DOCUMENTS

TW          202133327 A       9/2021

*Primary Examiner* — Younes Boulghassoul
(74) *Attorney, Agent, or Firm* — STUDEBAKER BRACKETT PLLC

(57)          ABSTRACT

In a method of manufacturing a semiconductor device, an n-type source/drain epitaxial layer and a p-type source/drain epitaxial layer respectively formed, a dielectric layer is formed over the n-type source/drain epitaxial layer and the p-type source/drain epitaxial layer, a first opening is formed in the dielectric layer to expose a part of the n-type source/drain epitaxial layer and a second opening is formed in the dielectric layer to expose a part of the p-type source/drain epitaxial layer, and the n-type source/drain epitaxial layer and the p-type source/drain epitaxial layer respectively recessed. A recessing amount of the n-type source/drain epitaxial layer is different from a recessing amount of the p-type source/drain epitaxial layer.

20 Claims, 14 Drawing Sheets

(51) Int. Cl.

| | |
|---|---|
| *H10D 30/62* | (2025.01) |
| *H10D 30/69* | (2025.01) |
| *H10D 62/13* | (2025.01) |
| *H10D 64/01* | (2025.01) |
| *H10D 84/03* | (2025.01) |
| *H10D 84/85* | (2025.01) |

(52) U.S. Cl.
CPC ....... *H10D 30/6219* (2025.01); *H10D 30/797* (2025.01); *H10D 62/151* (2025.01); *H10D 64/017* (2025.01); *H10D 84/0186* (2025.01); *H10D 84/0193* (2025.01); *H10D 84/038* (2025.01); *H10D 84/853* (2025.01)

(58) Field of Classification Search
CPC ............. H10D 84/013; H10D 84/0133; H10D 30/6713; H10D 30/0223; H10D 30/797; H10D 30/6219; H10D 30/6729; H10D 64/251–259; H10D 84/0149; H10D 84/0158; H10D 84/834; H10D 86/011; H10D 86/215; H10D 30/024–0245; H10D 30/62–6219; H10D 30/43–435; H10D 30/6757; H10D 30/6735; H10D 30/501–509; H10D 30/014; H10D 30/019–0198; H10D 62/119–123; H10D 84/832; H10D 84/833; H10B 12/36; H10B 12/056; H01L 21/823475; H01L 21/823871; H01L 21/76885; H01L 21/76895; H01L 21/76897; H01L 21/76804; H01L 21/76805; H01L 21/76816; H01L 21/76877; H01L 23/5226; H01L 23/5283; H01L 23/5286; H01L 23/528; H01L 23/481; H01L 23/535; H01L 23/5384; H01L 23/5386

See application file for complete search history.

(56) References Cited

U.S. PATENT DOCUMENTS

| | | | | |
|---|---|---|---|---|
| 2017/0053916 | A1* | 2/2017 | Ching | H10D 30/6219 |
| 2018/0090583 | A1* | 3/2018 | Choi | H01L 21/76855 |
| 2018/0286810 | A1* | 10/2018 | You | H10D 30/62 |
| 2019/0333820 | A1* | 10/2019 | Chang | H10D 84/853 |
| 2020/0075725 | A1* | 3/2020 | Wu | H01L 21/02532 |
| 2020/0279848 | A1* | 9/2020 | Wang | H10D 84/853 |
| 2021/0273102 | A1 | 9/2021 | Su et al. | |
| 2022/0051947 | A1* | 2/2022 | More | H10D 84/038 |
| 2022/0052044 | A1* | 2/2022 | More | H10D 84/0147 |
| 2022/0069092 | A1* | 3/2022 | Min | H01L 23/5283 |
| 2023/0260836 | A1* | 8/2023 | Chang | H01L 21/76879 438/653 |
| 2023/0299139 | A1* | 9/2023 | Cho | H10D 30/6729 |
| 2023/0395721 | A1* | 12/2023 | More | H10D 30/6211 |
| 2024/0021686 | A1* | 1/2024 | More | H10D 84/0128 |

* cited by examiner

METHOD OF MANUFACTURING A SEMICONDUCTOR DEVICE HAVING A DUMBBELL-SHAPED CONTACT CONNECTING DIFFERENTLY RECESSED SOURCE/DRAIN EPITAXIAL LAYERS

RELATED APPLICATIONS

This application claims priority to U.S. Provisional Patent Application No. 63/427,733 filed Nov. 23, 2022, the entire content of which is incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a fin FET (FinFET) and a gate-all-around (GAA) FET. In a FinFET, a gate electrode is adjacent to three side surfaces of a channel region with a gate dielectric layer interposed therebetween. A gate electrode of a FinFET includes one or more layers of metallic material formed by a gate replacement technology.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1-16 show a sequential process for manufacturing an FET device according to an embodiment of the present disclosure. It is understood that additional operations can be provided before, during, and after processes shown by FIGS. 1-16, and some of the operations described below can be replaced or eliminated, for additional embodiments of the method. The order of the operations/processes may be interchangeable.

Figure 1:
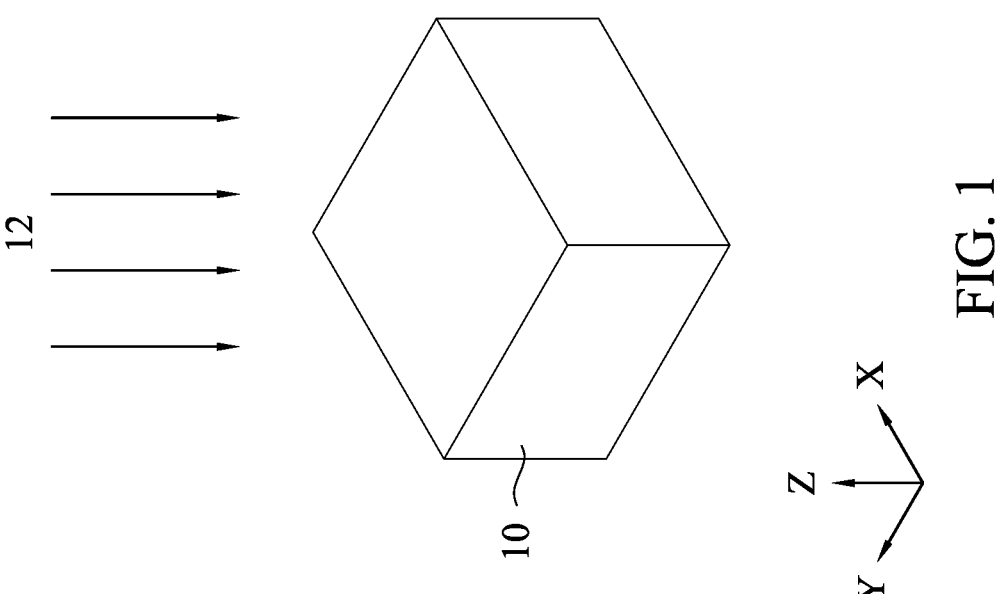

As shown in FIG. 1, impurity ions (dopants) 12 are implanted into a substrate 10 to form a well region. The ion implantation is performed to prevent a punch-through effect.

In one embodiment, the substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

The substrate 10 may include various regions that have been suitably doped with impurities (e.g., p-type or n-type conductivity). The dopants 12 are, for example boron ($BF_2$) for an n-type Fin FET and phosphorus for a p-type Fin FET.

Figure 2:
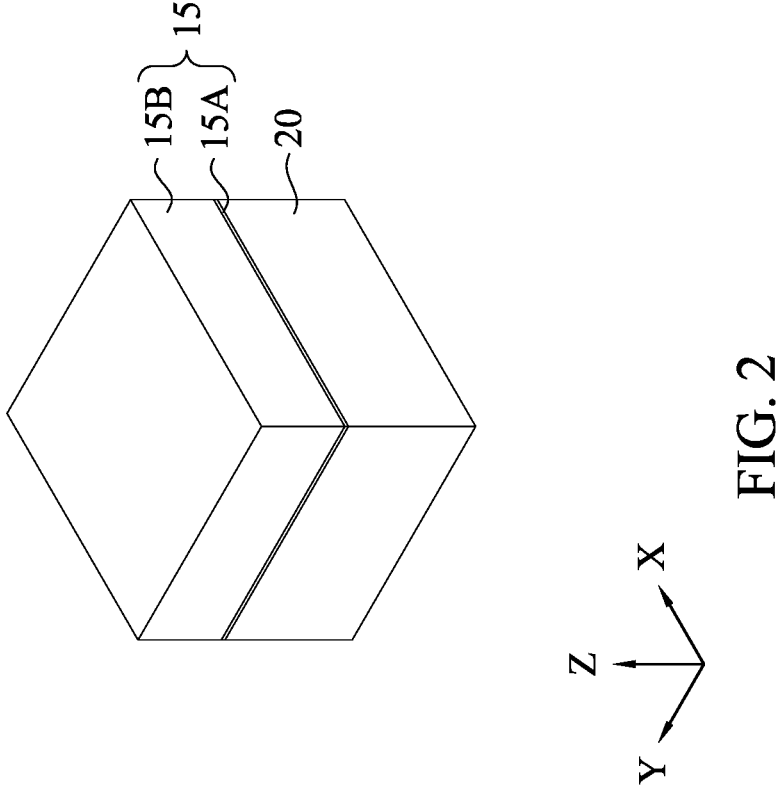
FIGS. 1, 2, 3, 4, 5, 6, 7, 8, 9, 10, 11, 12, 13, 14, 15 and 16 show various stages of a sequential process for manufacturing a semiconductor device according to an embodiment of the present disclosure.

In FIG. 2, a mask layer 15 is formed over the substrate 10. In some embodiments, the mask layer 15 includes a first mask layer 15A and a second mask layer 15B. In some embodiments, the first mask layer 15A is made of silicon nitride and the second mask layer 15B is made of a silicon oxide. In other embodiments, the first mask layer 15A is made of silicon oxide and the second mask layer 15B is made of silicon nitride (SiN). The first and second mask layers are formed by chemical vapor deposition (CVD), including low pressure CVD (LPCVD) and plasma enhanced CVD (PECVD), physical vapor deposition (PVD), atomic layer deposition (ALD), or other suitable process. The mask layer 15 is patterned into a mask pattern by using patterning operations including photo lithography and etching.

Figure 3:
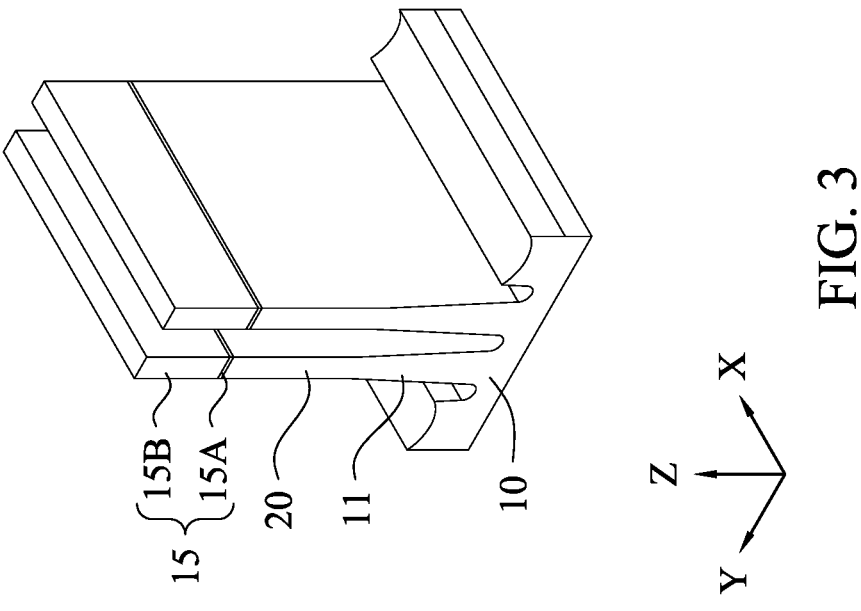

Next, as shown in FIG. 3, the substrate 10 is patterned by using the patterned mask layer 15 into fin structures 20 extending in the X direction. In FIG. 3, two fin structures 20 are arranged in the Y direction. However, the number of the fin structures is not limited to two, and may be as small as one and three or more. In some embodiments, one or more dummy fin structures are formed on both sides of the fin structures 20 to improve pattern fidelity in the patterning operations.

The fin structures 20 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and is patterned using a photolithography process. Spacers are formed alongside the patterned sacrificial layer using a self-aligned process. The sacrificial layer is then removed, and the remaining spacers may then be used to pattern the fin structures.

After the fin structures are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surfaces of the fin structures 20 are exposed from the insulating material layer 30 as shown in FIG. 4.

Figure 4:
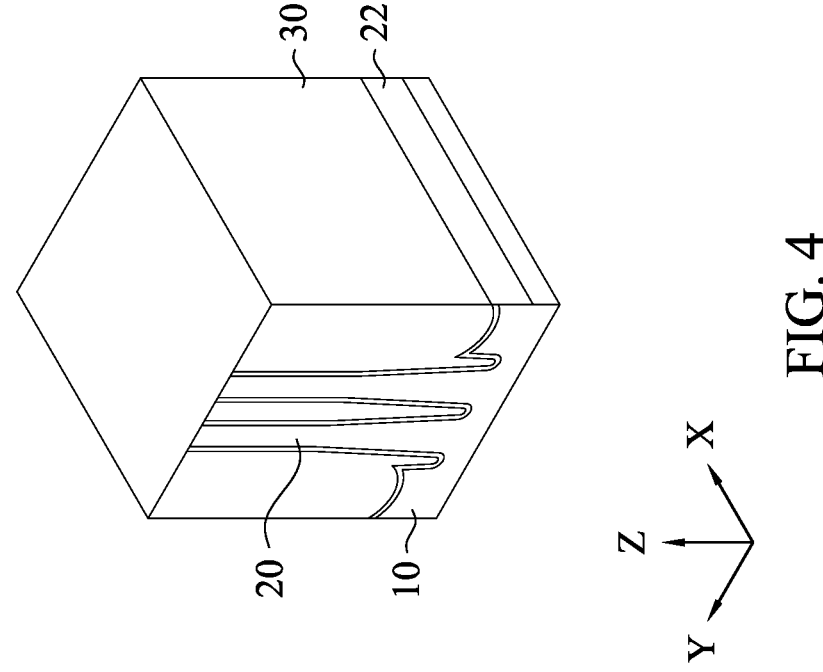

In some embodiments, one or more liner layers 22 are formed over the structure of FIG. 3 before forming the insulating material layer 30, as shown FIG. 4. The liner layer 22 includes one or more of silicon nitride, SiON, SiCN, SiOCN, and silicon oxide.

Figure 5:
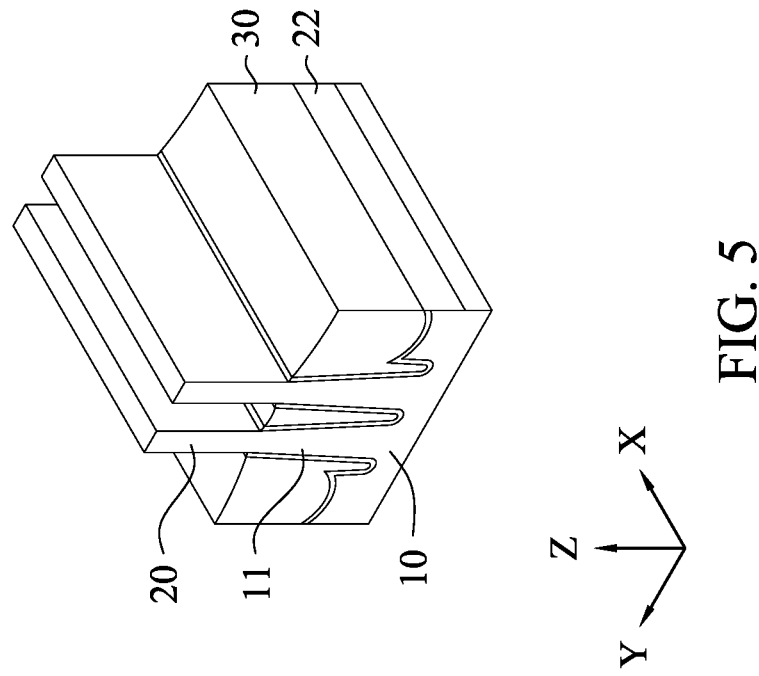

Then, as shown in FIG. 5, the insulating material layer 30 is recessed to form an isolation insulating layer 30 so that the upper portions of the fin structures 20 are exposed. With this operation, the fin structures 20 are electrically separated from each other by the isolation insulating layer 30, which is also called a shallow trench isolation (STI). The lower portion 11 of the fin structures are embedded in the isolation insulating layer 30.

Figure 6:
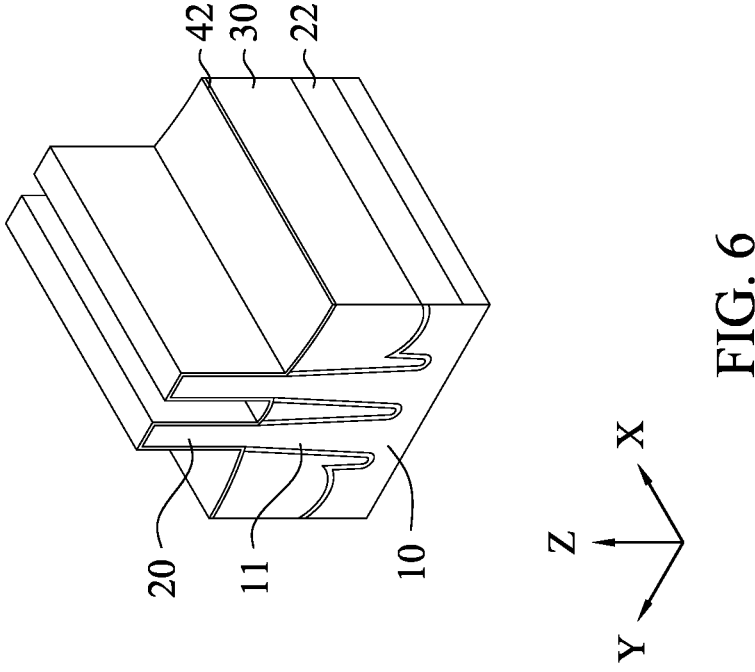

After the isolation insulating layer 30 is formed, a sacrificial gate dielectric layer 42 is formed, as shown in FIG. 6. The sacrificial gate dielectric layer 42 includes one or more layers of insulating material, such as a silicon oxide-based material. In one embodiment, silicon oxide formed by CVD is used. The thickness of the sacrificial gate dielectric layer 42 is in a range from about 1 nm to about 5 nm in some embodiments.

Figure 7:
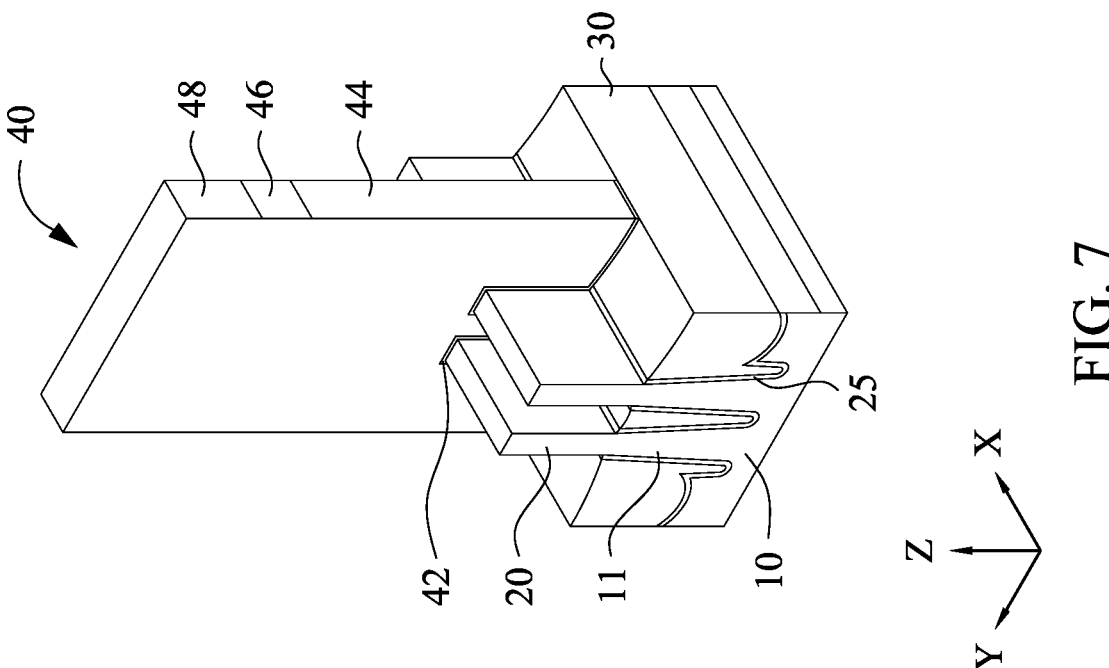

FIG. 7 illustrates a structure after a sacrificial gate structure 40 is formed over the exposed fin structures 20. The sacrificial gate structure includes a sacrificial gate electrode 44 and a sacrificial gate dielectric layer 42. The sacrificial gate structure 40 is formed over a portion of the fin structures, which is to be a channel region. The sacrificial gate structure 40 is formed by first blanket depositing the sacrificial gate dielectric layer 42 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 46 and a silicon oxide mask layer 48.

Next, a patterning operation is performed on the mask layer and sacrificial gate electrode layer is patterned into the sacrificial gate structure 40, as shown in FIG. 7. The patterning operations of sacrificial gate structure 40 will be explained below in more detail.

The sacrificial gate structure 40 includes the sacrificial gate dielectric layer 42, the sacrificial gate electrode layer 44 (e.g., poly silicon), the pad SiN layer 46 and the silicon oxide mask layer 48 in some embodiments. By patterning the sacrificial gate structure 40, the upper portions of the fin structures 20 are partially exposed on opposite sides of the sacrificial gate structure 40, thereby defining source/drain (S/D) regions, as shown in FIG. 7. In this disclosure, a source and a drain are interchangeably used and the structures thereof are substantially the same. In FIG. 7, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Figure 8:
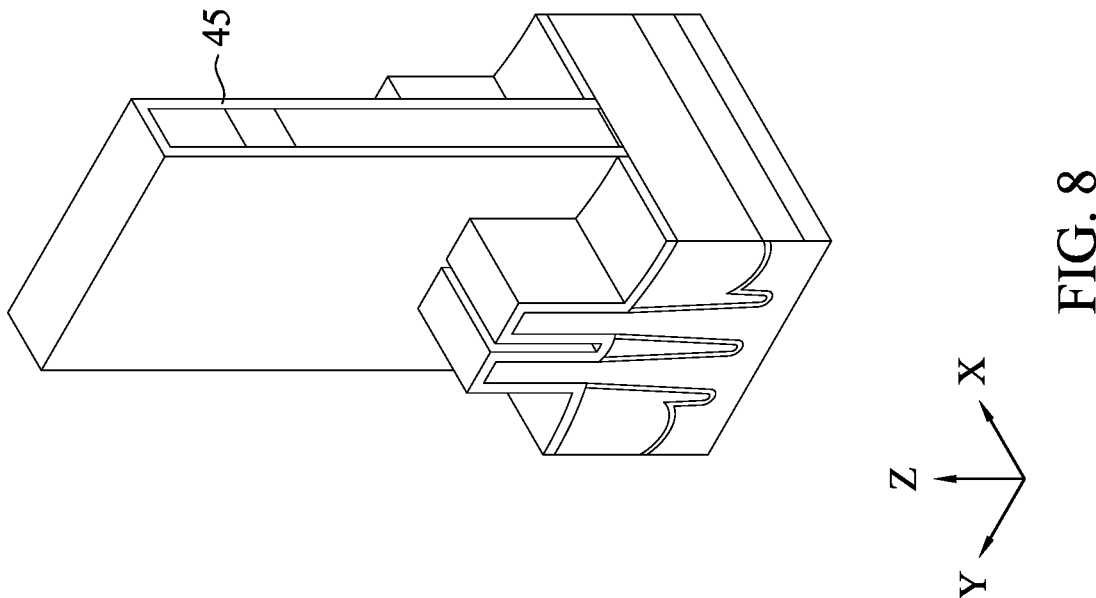

After the sacrificial gate structure 40 is formed, a blanket layer 45 of an insulating material for sidewall spacers 45 is conformally formed by using CVD or other suitable methods, as shown in FIG. 8. The blanket layer 45 is deposited in a conformal manner so that it is formed to have substantially equal thicknesses on vertical surfaces, such as the sidewalls, horizontal surfaces, and the top of the sacrificial gate structure. In some embodiments, the blanket layer 45 is deposited to a thickness in a range from about 2 nm to about 10 nm. In one embodiment, the insulating material of the blanket layer 45 is a silicon nitride-based material, such as SiN, SiON, SiOCN or SiCN and combinations thereof.

Figure 9:
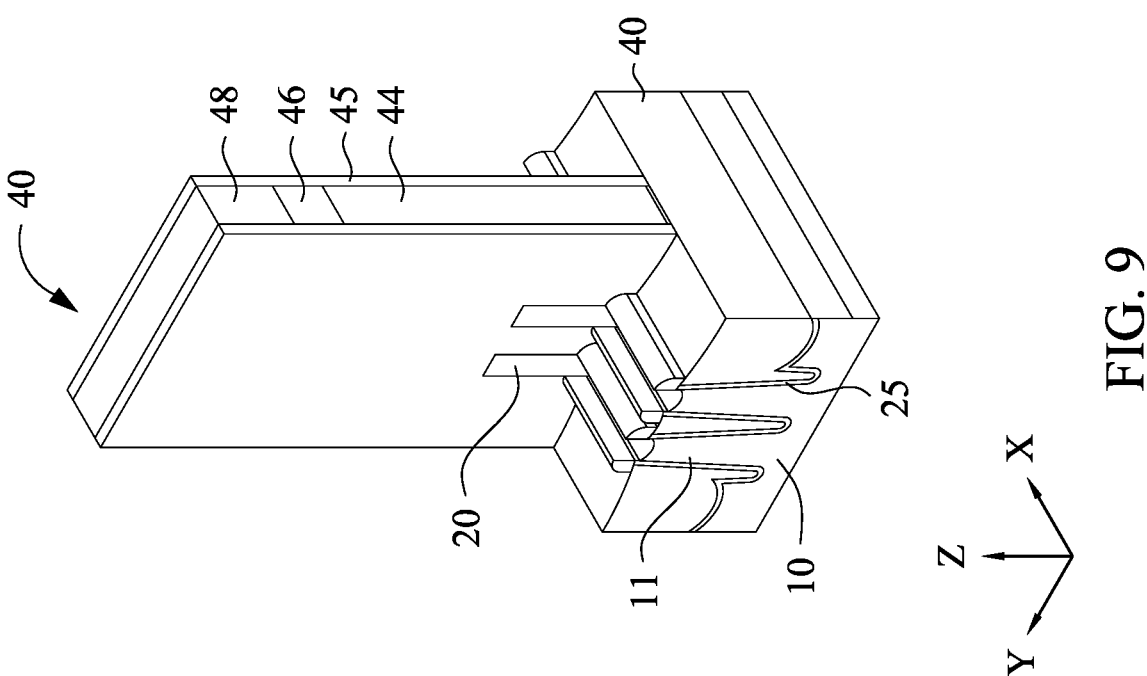

Further, as shown in FIG. 9, sidewall spacers 45 are formed on opposite sidewalls of the sacrificial gate structures, and subsequently, the fin structures of the S/D regions are recessed down below the upper surface of the isolation insulating layer 30. After the blanket layer 45 is formed, anisotropic etching is performed on the blanket layer 45 using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. The mask layer 48 may be exposed from the sidewall spacers. In some embodiments, isotropic etching may be subsequently performed to remove the insulating material from the upper portions of the S/D region of the exposed fin structures 20.

Subsequently, the fin structures of the S/D regions are recessed down below the upper surface of the isolation insulating layer 30, by using dry etching and/or wet etching. As shown in FIG. 9, the sidewall spacers 45 formed on the S/D regions of the exposed fin structures (fin sidewalls) partially remain. In other embodiments, however, the sidewall spacers 45 formed on the S/D regions of the exposed fin structures are fully removed. In case of a GAA FET, inner spacers are formed after the recessing the S/D regions.

Figure 10:
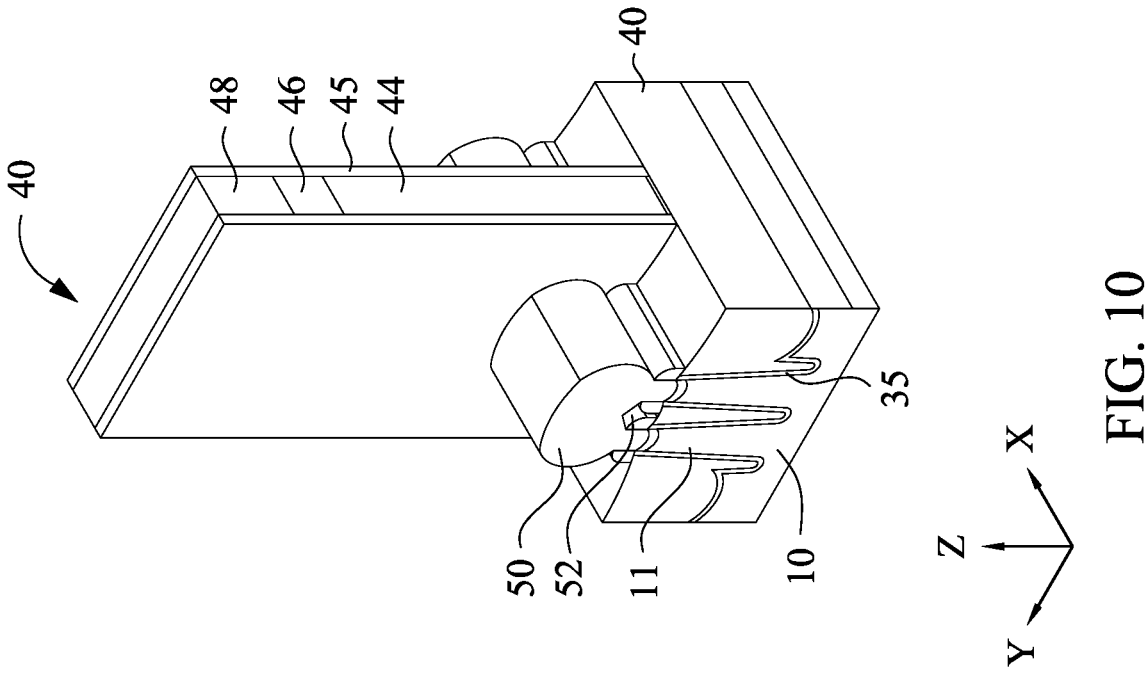

Subsequently, as shown in FIG. 10, source/drain (S/D) epitaxial layers 50 are formed. The S/D epitaxial layer 50 includes one or more layers of Si, SiP, SiC and SiCP for an n-channel FET or Si, SiGe, Ge, GeSn and SiGeSn for a p-channel FET. The S/D layers 50 are formed by an epitaxial growth method using CVD, ALD or molecular beam epitaxy (MBE).

As shown in FIG. 10, the S/D epitaxial layers grow from the recessed fin structures respectively. The grown epitaxial layers merge above the isolation insulating layer and form a void 52 in some embodiments.

Figure 11:
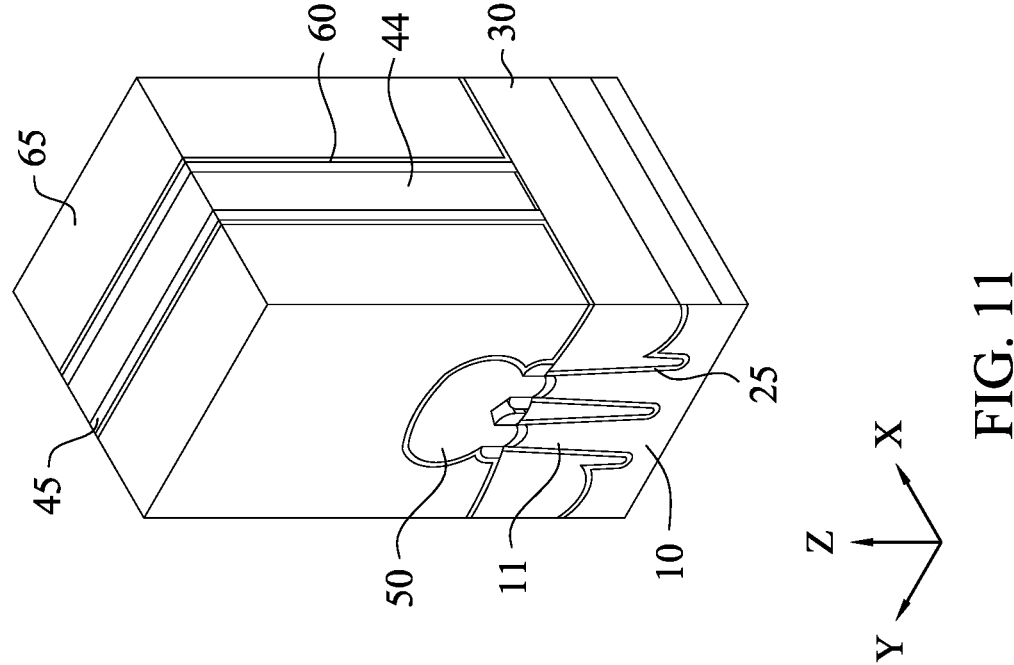

Subsequently, an insulating liner layer 60, as a first etch stop layer, is formed and then an interlayer dielectric (ILD) layer 65 is formed, as shown in FIG. 11. The insulating liner layer 60 is made of a silicon nitride-based material, such as SiN, and functions as a contact etch stop layer in the subsequent etching operations. The materials for the ILD layer 65 include compounds comprising Si, O, C and/or H, such as silicon oxide, SiCOH and SiOC. Organic materials, such as polymers, may be used for the ILD layer 65. After the ILD layer 65 is formed, a planarization operation, such as CMP, is performed, so that the top portion of the sacrificial gate electrode layer 44 is exposed, as shown in FIG. 11.

Figure 12:
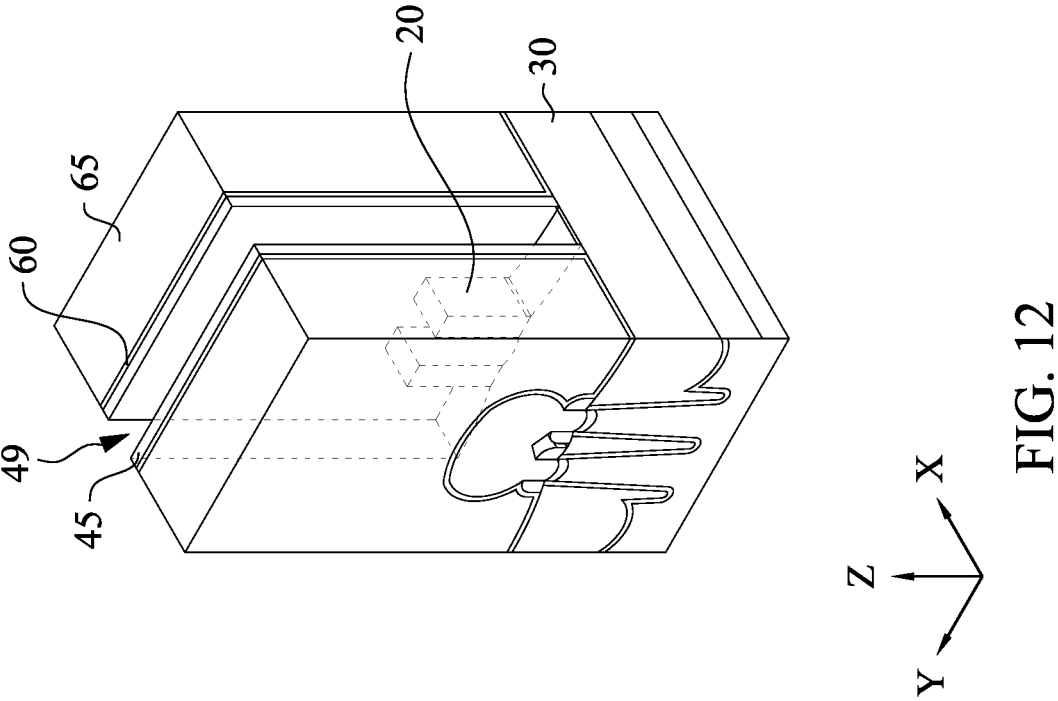

Next, as shown in FIG. 12, the sacrificial gate electrode layer 44 and sacrificial gate dielectric layer 42 are removed, thereby exposing the fin structures in a gate space 49. The ILD layer 65 protects the S/D structures 50 during the removal of the sacrificial gate structures. The sacrificial gate structures can be removed using plasma dry etching and/or wet etching. When the sacrificial gate electrode layer 44 is polysilicon and the ILD layer 65 is silicon oxide, a wet etchant such as a TMAH solution can be used to selectively remove the sacrificial gate electrode layer 54. The sacrificial gate dielectric layer 42 is thereafter removed using plasma dry etching and/or wet etching.

Figure 13:
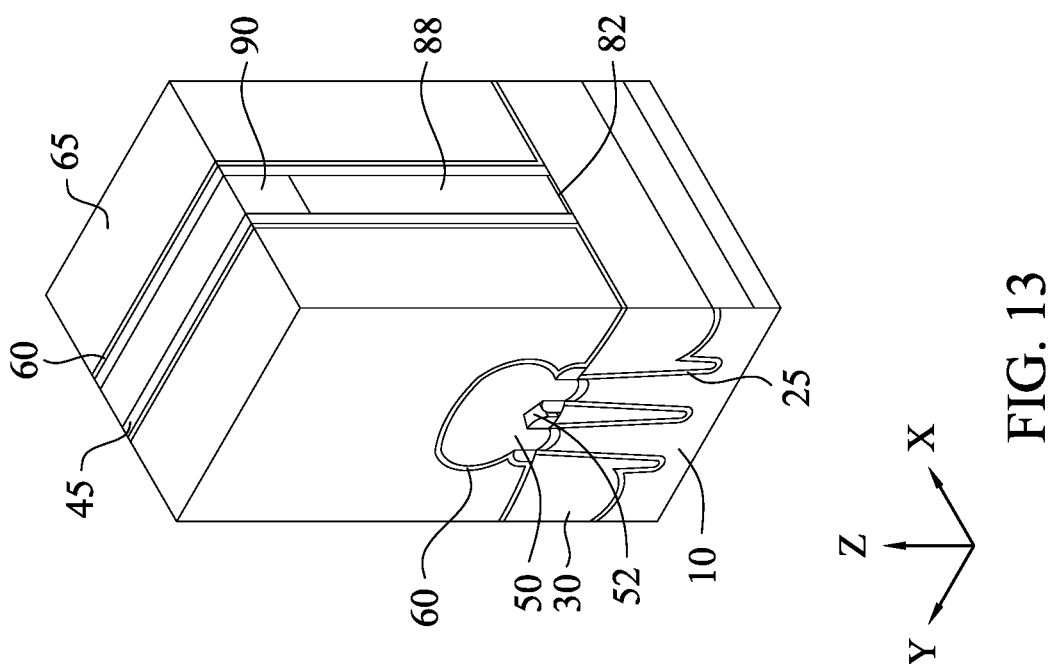

After the sacrificial gate structures are removed, a gate dielectric layer 82 is formed around the exposed fin structures 20, and a gate electrode layer 88 is formed on the gate dielectric layer 82, as shown in FIG. 13.

In certain embodiments, the gate dielectric layer 82 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 82 includes an interfacial layer formed between the channel layers and the dielectric material.

The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness on the channel regions. The thickness of the gate dielectric layer 82 is in a range from about 1 nm to about 6 nm in some embodiments.

The gate electrode layer 88 is formed on the gate dielectric layer 82. The gate electrode 88 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 88 may be formed by CVD, ALD, electro-plating, or other suitable method. The gate electrode layer is also deposited over the upper surface of the ILD layer 65. The gate dielectric layer and the gate electrode layer formed over the ILD layer 65 are then planarized by using, for example, CMP, until the top surface of the ILD layer 65 is revealed.

After the planarization operation, the gate electrode layer 88 is recessed and a cap insulating layer 90 is formed over the recessed gate electrode 88, as shown in FIG. 13. In some embodiments, the cap insulating layer 90 includes one or more layers of a silicon nitride-based material, such as SiN. The cap insulating layer 90 can be formed by depositing an insulating material followed by a planarization operation.

In certain embodiments of the present disclosure, one or more work function adjustment layers (not shown) are interposed between the gate dielectric layer 82 and the gate electrode 88. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of WN, WCN, W, Ru, Co, TiN or TiSiN is used as the work function adjustment layer. The work function adjustment layer may be formed by ALD, PVD, CVD, e-beam evaporation, or other suitable process. Further, the work function adjustment layer may be formed separately for the n-channel FET and the p-channel FET, which may use different metal layers.

Figure 14:
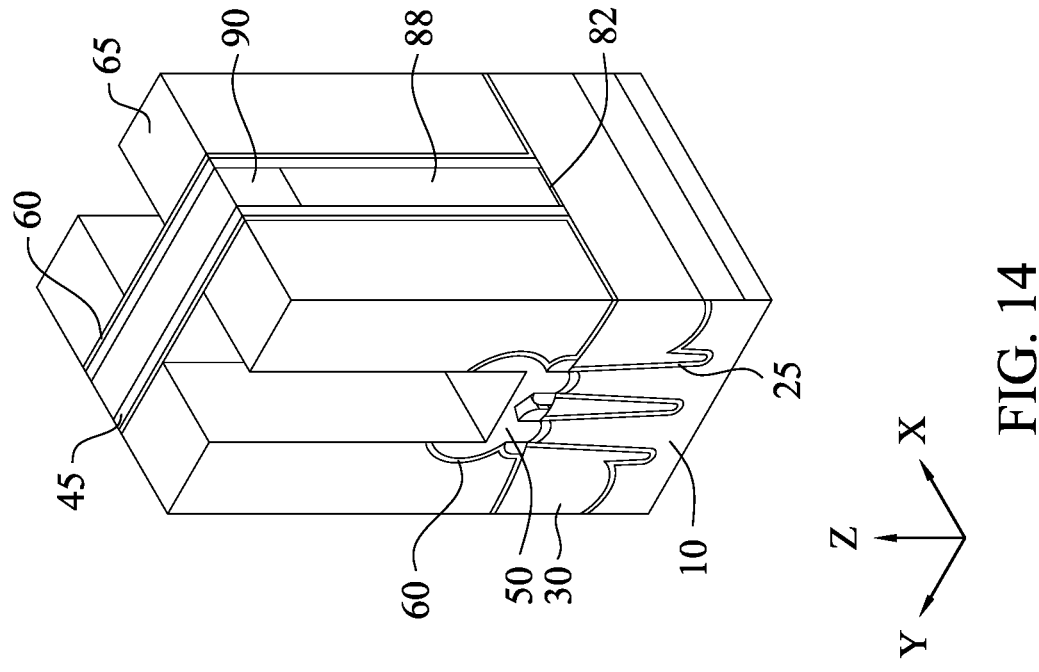

Subsequently, contact holes 110 are formed in the ILD layer 65 by using dry etching, as shown in FIG. 14. In some embodiments, the upper portion of the S/D epitaxial layer 50 is etched.

Figure 16:
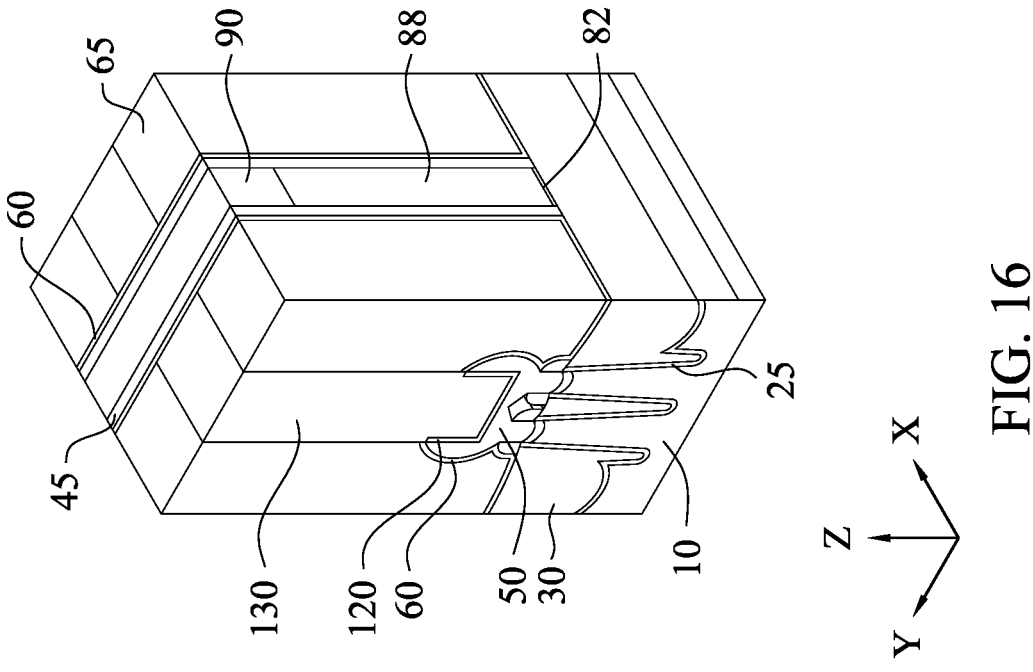
Figure 15:
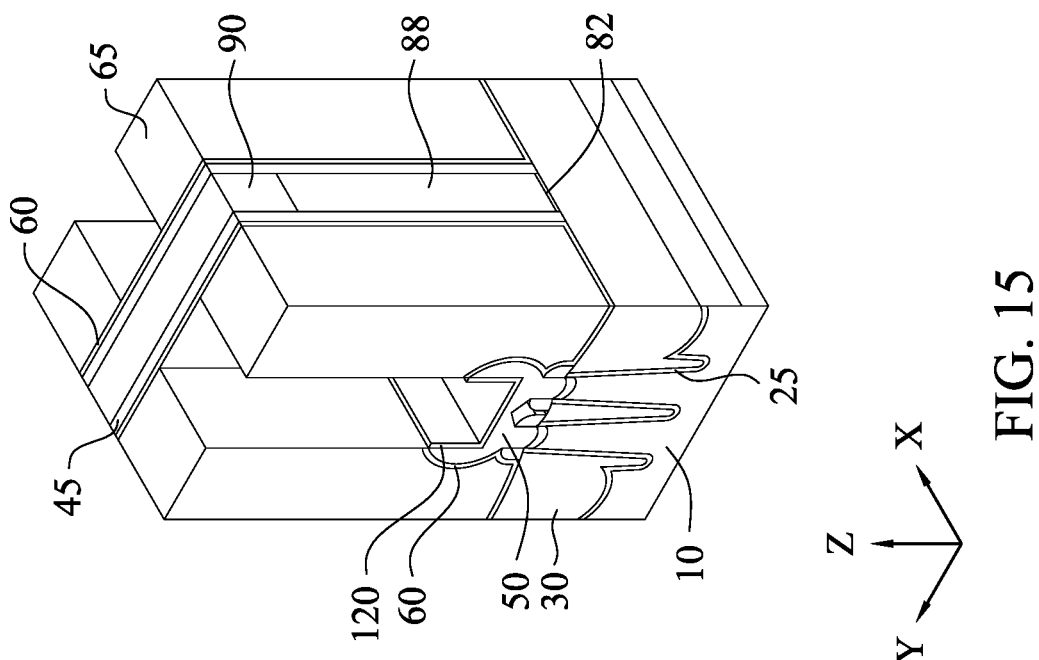

A silicide layer 120 is formed over the S/D epitaxial layer 50, as shown in FIG. 15. The silicide layer includes one or more of WSi, CoSi, NiSi, TiSi, MoSi and TaSi. Then, a conductive material 130 is formed in the contact holes as shown in FIG. 16 to form a source/drain contact 130. The conductive material for the source/drain contact 130 includes one or more of Co, Ni, W, Ti, Ta, Cu, Al, TiN and TaN.

It is understood that the FinFETs undergo further CMOS processes to form various features such as contacts/vias, interconnect metal layers, dielectric layers, passivation layers, etc.

FIGS. 17-21B show various views of a detailed sequential process of FIGS. 13-16 according to an embodiment of the present disclosure. It is understood that additional operations can be provided before, during, and after processes shown by FIGS. 17-21B, and some of the operations described below can be replaced or eliminated, for additional embodiments of the method. The order of the operations/processes may be interchangeable. Materials, processes, methods, dimensions and/or configurations as explained with the foregoing embodiments may be applied to the following embodiments, and detailed description thereof may be omitted.

Figures 17, 18, 19, 20:
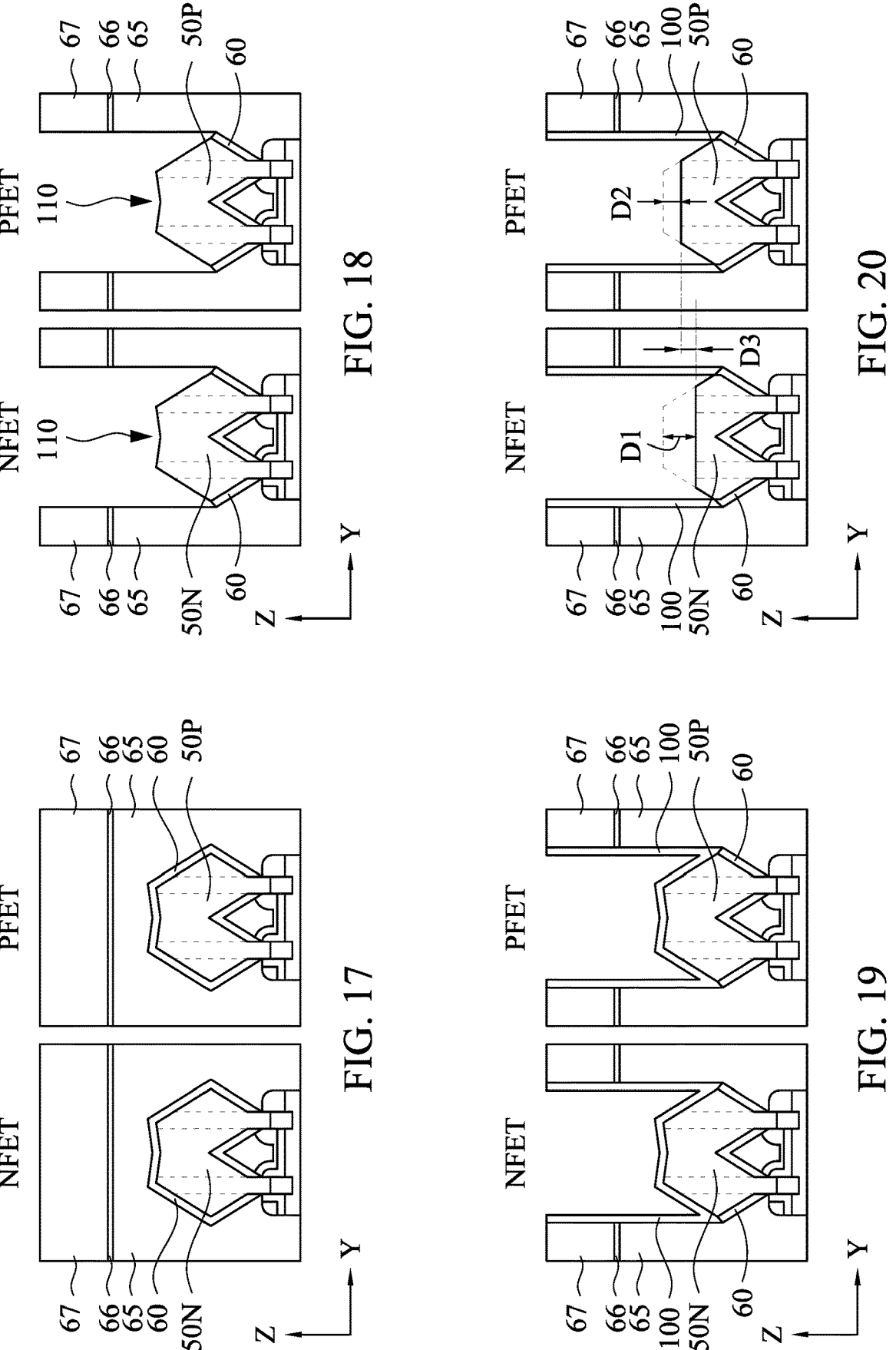
FIGS. 17, 18, 19, 20 and 21A and 21B show various stages of a sequential process for manufacturing a semiconductor device according to an embodiment of the present disclosure.

In some embodiments, after the structure shown in FIG. 13 is formed, a second etch stop layer 66 and a second ILD layer 67 are formed over the first ILD layer 65, as shown in FIG. 17. FIG. 17 shows cross sectional views for an n-type FET (NFET) including a n-type epitaxial layer 50N and a p-type FET (PFET) including a p-type epitaxial layer 50P. In some embodiments, the second etch stop layer 66 is made of a silicon nitride-based material, such as SiN. The materials for the second ILD layer 67 includes compounds comprising Si, O, C and/or H, such as silicon oxide, SiCOH and SiOC. Organic materials, such as polymers, may be used for the ILD layers. After the second ILD layer 67 is formed, a planarization operation, such as CMP, is performed. In some embodiments, the thickness of the second etch stop layer 66 is in a range from about 1 nm to about 5 nm. In some embodiments, the thickness of the second ILD layer 67 is in a range from about 1 nm to about 25 nm.

Then, as shown in FIG. 18, source/drain contact holes 110 are formed over the epitaxial layers 50N and 50P, respectively, by using one or more lithography and etching operations. In some embodiments, the bottom of the contact holes 110 is located at the same level as the point where the source/drain epitaxial layer (merged epitaxial layer) has the maximum width. In some embodiments, the bottom width of the contact hole 110 is substantially equal to the maximum width. In other embodiments, the bottom width of the contact hole 110 is smaller than the maximum width. As shown in FIG. 18, a part of the first etch stop layer (insulating layer) 60 on the source/drain epitaxial layer 50N, 50P is removed and a part of the source/drain epitaxial layer 50N, 50P is exposed in the contact hole 110.

Next, as shown in FIG. 19, a liner insulating layer 100 is formed on the inner sidewall of the contact hole 110 and the exposed source/drain epitaxial layer 50N, 50P. In some embodiments, the liner insulating layer 100 is made of a silicon nitride-based material, such as SiN. In some embodiments, the thickness of the liner insulating layer 100 is in a range from about 1 nm to about 5 nm. The liner insulating layer 100 is formed by LPCVD, plasma-CVD, ALD or any other suitable film formation methods.

Then, as shown in FIG. 20, the liner insulating layer 100 formed on the exposed source/drain epitaxial layer 50N, 50P is removed by etching, and then a part of the exposed source/drain epitaxial layer 50N, 50P is recessed (etched).

In some embodiments, the recessed amount D1 (recessed thickness=a top of the epitaxial layer before recess etching—a top of the epitaxial layer after the recess etching) of the n-type epitaxial layer 50N is greater than the recessed amount D2 of the p-type epitaxial layer 50P. In some embodiments, the recessed amount D1 of the n-type epitaxial layer 50N is in a range from about 10 nm to about 20 nm, from about 11 nm to about 18 nm, or from about 12 nm to about 15 nm, depending on the process and/or design requirements. In some embodiments, the recessed amount D2 of the p-type epitaxial layer 50P is in a range from about 5 nm to about 15 nm, from about 7 nm to about 12 nm, or from about 8 nm to about 10 nm, depending on the process and/or design requirements. In some embodiments, the difference D3 between the recessed amounts D1 and D2 is in a range from about 1 nm to about 15 nm and is in a range from about 2 nm to about 6 nm in other embodiments, depending on the process and/or design requirements. In some embodiments, the amount D3 is substantially equal to the height difference between the p-type epitaxial layer 50P and the n-type epitaxial layer 50N measured from, for example, the upper surface of the isolation insulating layer (or any reference plane). Having such a difference D3 between the p-type epitaxial layer 50P and the n-type epitaxial layer 50N can improve device performance and reliability.

In some embodiments, the recess etching of the n-type epitaxial layer 50N and the p-type epitaxial layer 50P is performed at the same time using one or more plasma and/or chemical etching operations. In some embodiments, the n-type epitaxial layer 50P includes one or more layers of SiP, SiCP, SiAs and/or SiAsP with different P, C and/or As concentrations, and the p-type epitaxial layer 50P includes one or more layers of SiGe and/or SiGeSn with different Ge concentrations. In some embodiments, the p-type epitaxial layer 50P includes boron (B). When the etching gas used in the recess etching includes a gas containing sulfur (S), a passivation or a byproduct layer containing Ge and S (e.g., $GeS_x$) is formed over the p-type source/drain epitaxial layer 50P. Such a passivation or byproduct layer suppresses an etching rate of the p-type source/drain epitaxial layer 50P, while no such suppression of an etching rate occurs for the n-type source/drain epitaxial layer. By controlling one or more parameters of the etching operation (e.g., gas flow rate, process pressure and/or process temperature), a desired amount of the difference D3 between the recess amount D1 of the n-type epitaxial layer 50N and the recess amount D2 of the p-type epitaxial layer 50P is obtained.

In some embodiments, the etching source gas includes at least one of COS (carbonyl sulfide) or $SF_6$, and one or more of fluorocarbon (e.g., $CF_4$, $C_4F_6$, $C_4F_8$, $CH_2F_2$, $CH_3F$ and/or $CHF_3$), $H_2$, $O_2$, Ar and/or $N_2$. In some embodiments, the process pressure is in a range from about 1 mTorr to about 100 mTorr. In some embodiments, the input power for the plasma etching operation is in a range from about 25 W to about 1000 W. In some embodiments, the process temperature is in a range from about 0° C. to about 350° C. and is in a range from about 150° C. to about 250° C. in other embodiments.

In other embodiments, the etching or recessing the source/drain epitaxial layer is performed separately for the n-type epitaxial layer and the p-type epitaxial layer. In such a case, the contact hole etching and the liner insulating layer formation as shown in FIGS. 18 and 19 are separately performed for the n-type epitaxial layer and the p-type epitaxial layer, while one of the p-type region or the n-type region is covered by a cover layer (e.g., a photo resist).

Figure 21A:
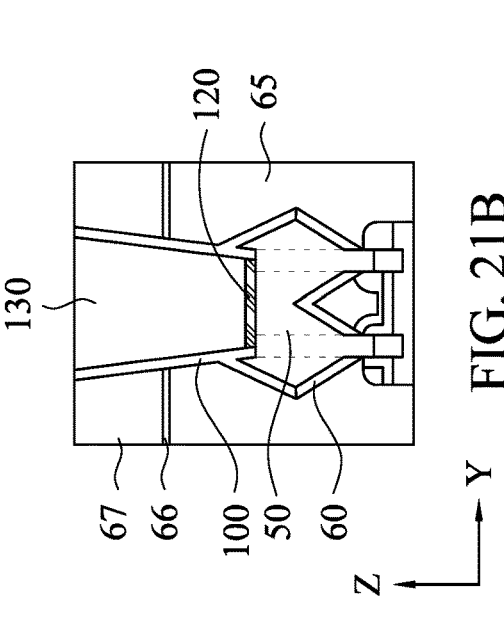

After the source/drain epitaxial layers 50N and 50P are recessed, a silicide layer 120 is formed over the recessed p-type epitaxial layer and n-type epitaxial layers and the source/drain contact 130 is formed over the silicide layer 120, respectively, as shown in FIG. 21A.

Figure 21B:
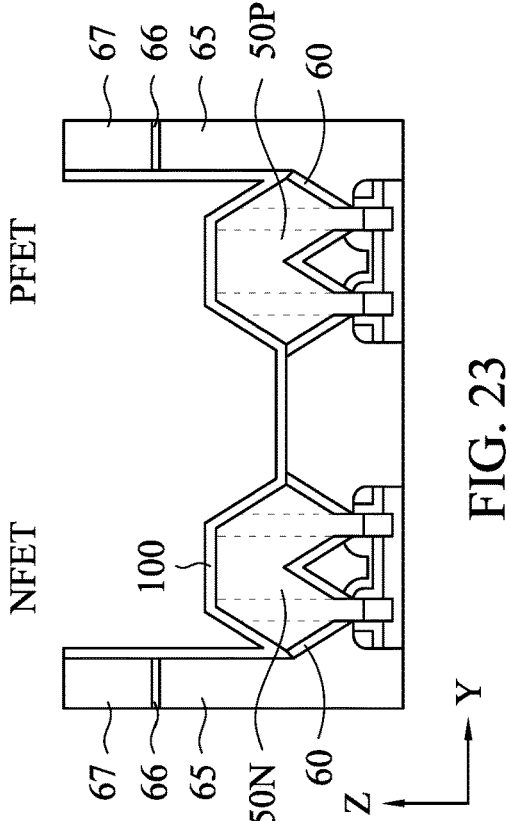

In some embodiments, as shown in FIG. 21B, the source/drain contact 130 has a tapered shape having a top width greater than a bottom width. In some embodiments, the taper angle with respect to the horizontal plane (parallel to a surface of the substrate) is less than 90 degrees and equal to or more than 85 degrees in the cross section along the Y direction. In some embodiments, the taper angle with respect to the horizontal plane (parallel to a surface of the substrate) is less than 90 degrees and equal to or more than 86 degrees in the cross section along the X direction. In some embodiments, the bottom width of the source/drain contact 130 is smaller than the width of the source/drain epitaxial layer 50 at the level equal to the bottom of the source/drain contact 130 in the Y direction. In some embodiments, the bottom width in the X direction is in a range from about 10 nm to about 45 nm or in a range from about 12 nm to about 18 nm in other embodiments.

FIGS. 22-25 show various views of a detailed sequential process of FIGS. 13-16 according to an embodiment of the present disclosure. It is understood that additional operations can be provided before, during, and after processes shown by FIGS. 22-25, and some of the operations described below can be replaced or eliminated, for additional embodiments of the method. The order of the operations/processes may be interchangeable. Materials, processes, methods, dimensions and/or configurations as explained with the foregoing embodiments may be applied to the following embodiments, and detailed description thereof may be omitted.

In some embodiments, a source/drain contact 130 is formed over the n-type epitaxial layer 50N and the p-type epitaxial layer 50P, thereby connecting the n-type epitaxial layer 50N and the p-type epitaxial layer 50P.

Figure 22:
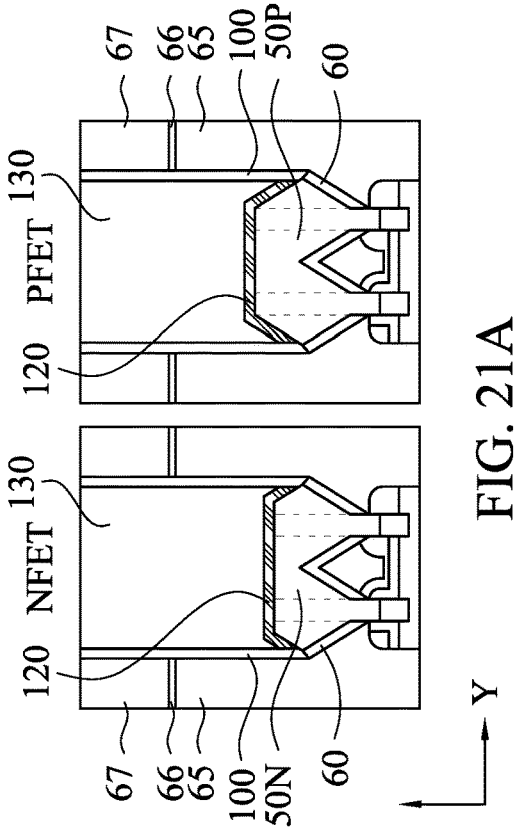
FIGS. 22, 23, 24, 25A, 25B and 25C show various stages of a sequential process for manufacturing a semiconductor device according to an embodiment of the present disclosure.

As shown in FIG. 22, a contact hole 110' is continuously formed over the epitaxial layers 50N and 50P adjacent to each other by using one or more lithography and etching operations. As shown in FIG. 22, a part of the first etch stop layer 60 on the source/drain epitaxial layer 50N, 50P is removed and a part of the source/drain epitaxial layer 50N, 50P is exposed in the contact hole 110'. In some embodiments, the first ILD layer 65 between the n-type epitaxial layer 50N and the p-type epitaxial layer 50P is etched more than the etch stop layer 60 causing a recessed or concave portion between the n-type epitaxial layer 50N and the p-type epitaxial layer 50P.

Figure 23:
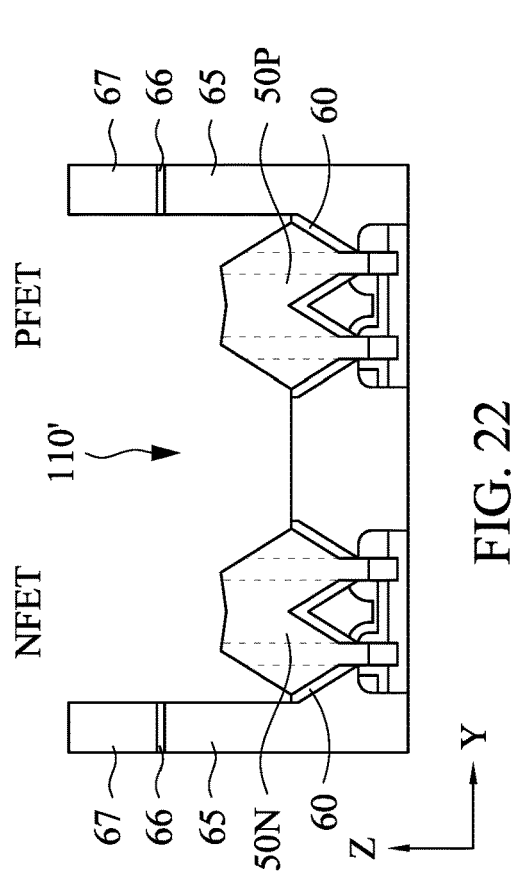
Figures 24, 25A:
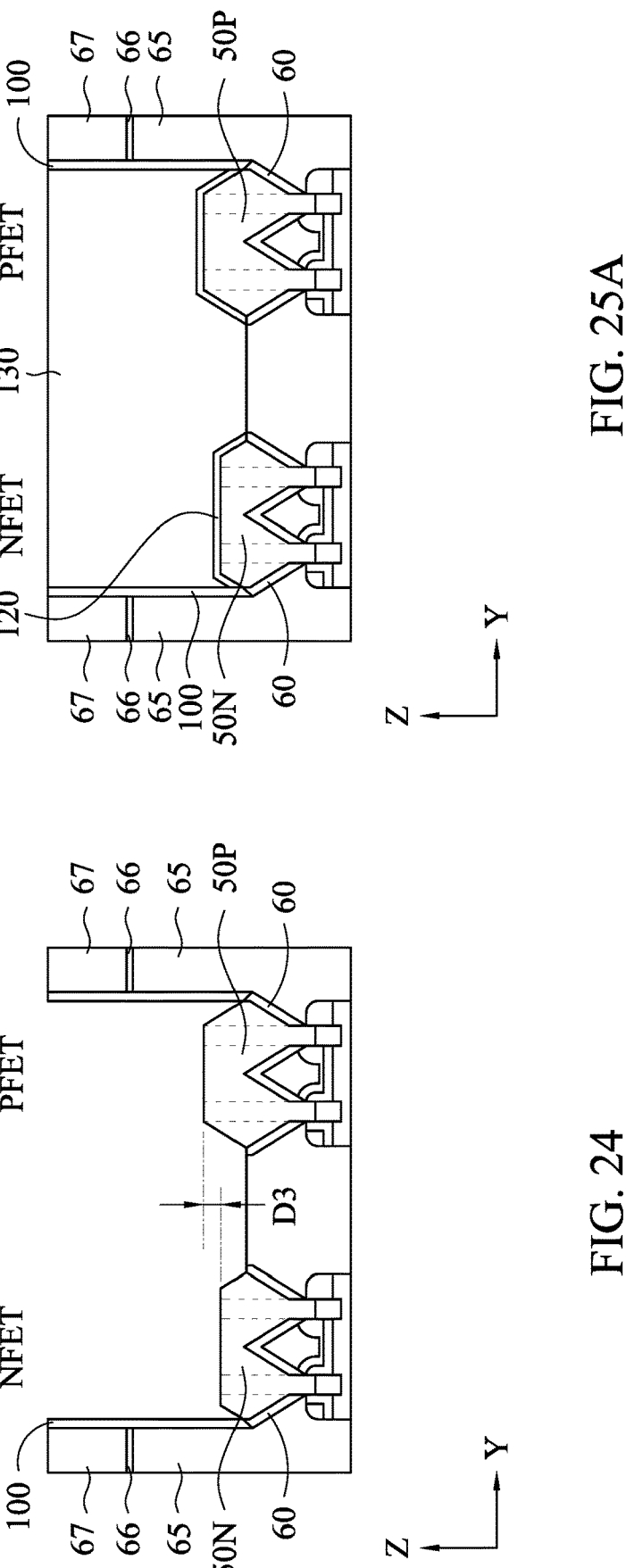

Next, as shown in FIG. 23, a liner insulating layer 100 is formed on the inner sidewall of the contact hole 110' and the exposed source/drain epitaxial layers 50N, 50P, similar to FIG. 19. Then, as shown in FIG. 24, the liner insulating layer 100 formed on the exposed source/drain epitaxial layers 50N, 50P is removed by etching, and then a part of the exposed source/drain epitaxial layer 50N, 50P is recessed, respectively. As set forth above, when the p-type epitaxial layer 50P includes Ge (e.g., SiGe) and the etching gas includes a gas containing S, the etching rate of the p-type epitaxial layer 50P is smaller than the etching rate of the n-type epitaxial layer 50N, and thus the height difference D3 between the top of the p-type epitaxial layer 50P and the top of the n-type epitaxial layer 50N as set forth above is obtained, as shown in FIG. 24.

Figure 25C:
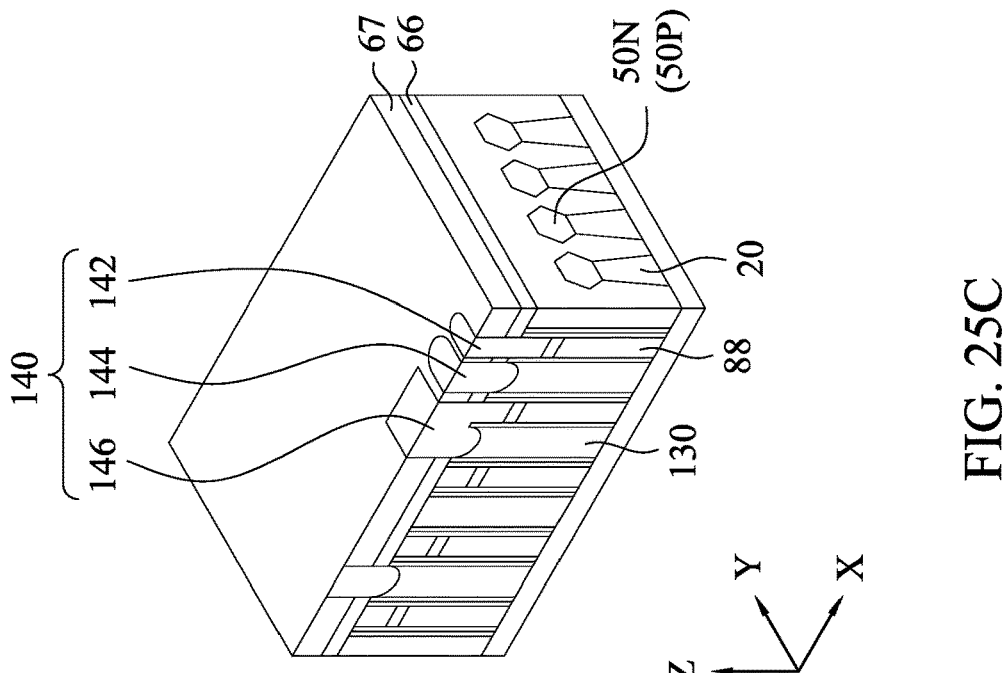
Figure 25B:
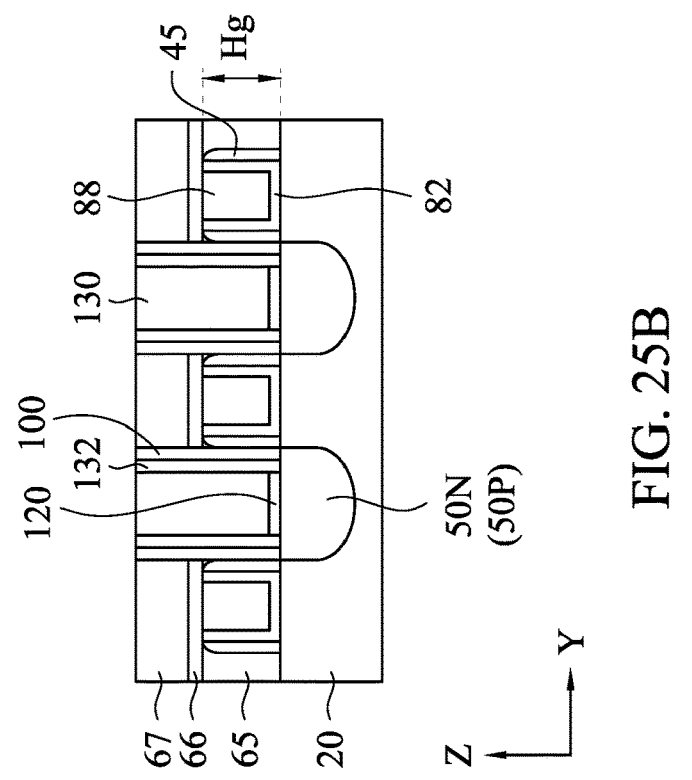

Subsequently, a silicide layer 120 is formed over the recessed p-type epitaxial layer and n-type epitaxial layers and the source/drain contact 130 is formed over the silicide layer 120, as shown in FIGS. 25A-25C. FIG. 25B shows a cross sectional view along the X direction. In some embodiments, the height Hg of the metal gate electrode 88 from the top of the channel region 20 (top of the fin) is in a range from about 9 nm to about 100 nm, and is in a range from about 20 nm to about 50 nm in other embodiments. In some embodiments, a barrier or liner conductive layer 132 is formed before the source/drain contact 130 is formed. In some embodiments, the barrier layer 132 is made of Ti and/or TiN. In some embodiments, the barrier layer 132 is a combination of Ti (about 0.2 nm to about 2 nm) and TiN (about 0.3 nm to about 3 nm).

FIG. 25C also shows upper contact structures 140 including a gate contact 142 contacting the gate electrode 88, an upper source/drain contact 144 contacting the source/drain contact 130 and a hybrid contact contacting the gate electrode 88 and the source/drain contact 130. In some embodiments, the upper contact structures 140 are made of W, Co, or any suitable conductive material.

Figure 26C:
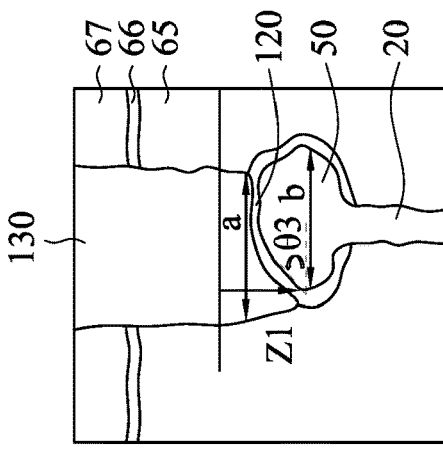
FIGS. 26A, 26B and 26C shows cross sectional view of a semiconductor device according to embodiments of the present disclosure.
Figure 26B:
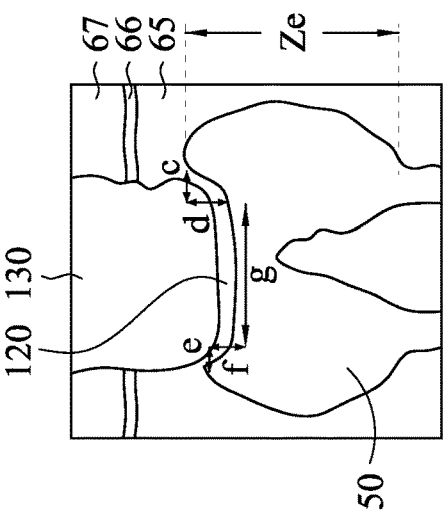
Figure 26A:
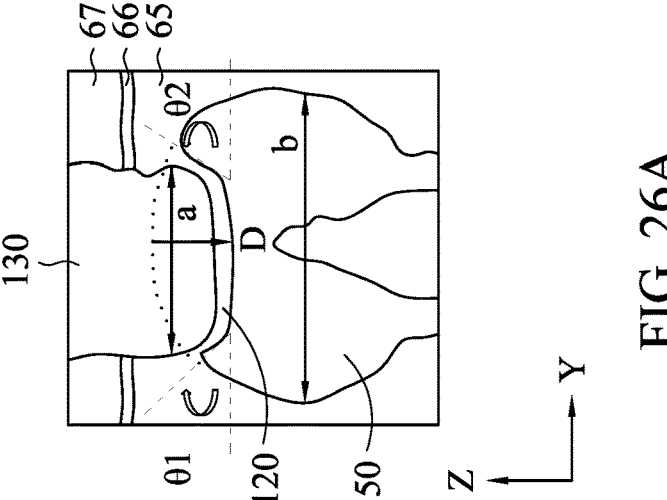

FIGS. 26A-26C show cross sectional views of the source/drain contact and source/drain epitaxial layer according to embodiments of the present disclosure.

In FIGS. 26A and 26B, "a" is a width in the Y direction of the source/drain contact 130 measured at a top of the source/drain epitaxial layer 50 (50N or 50P), and "b" is the largest width of the source/drain epitaxial layer 50. In some embodiments, "a" is equal to or smaller than "b". "D" is a recess amount corresponding to D1 and/or D2. Each of the angles θ1 and θ2 is an angle between the silicide layer 120 (or the source/drain contact 130) and the epitaxial layer 50 at contact edges therebetween. In some embodiments, the angles θ1 and θ2 are in a range from about 0 degrees to about 75 degrees, from about 10 degrees to about 60 degrees or from about 30 degrees to about 45 degrees, depending on the design and/or process requirements.

When the source/drain contact 130 is perfectly aligned with the source/drain epitaxial layer (the center of the source/drain epitaxial layer, corresponding to the center between the fin structures 20 over which the source/drain epitaxial layer is formed), the angles θ1 and θ2 are equal to each other. When the angle θ1 is smaller than the angle θ2, the depth "d" from the contact edge (right side) to the bottom of the silicide layer 120 is greater than the depth "f" from the contact edge (left side) to the bottom of the silicide layer 120, and length "c" from the contact edge (right side) to the bottom of the silicide layer 120 is greater than the length "e" from the contact edge (left side) to the bottom of the silicide layer 120.

When "a" is greater than "b" and/or there is an overlay error between the source/drain contact and the epitaxial layer, as shown in FIG. 26C, a tiger tooth shape of the source/drain contact 130 is observed at one edge or both edges of the source/drain epitaxial layer 50. In some embodiments, the depth Z1 from the top of the epitaxial layer 50 to the bottom of the tooth is equal to or smaller than a half of the vertical height Ze of the epitaxial layer 50. In some embodiments, the angle θ3 of the inclined portion of the tiger tooth with respect to the horizontal plane is in a range from 0 degrees to about 85 degrees, from about 15 degrees to about 70 degrees or from about 30 degrees to about 60 degrees, depending on the design and/or process requirements.

In some embodiments, the landing or contacting length L of the source/drain contact 130 (including silicide layer 120) to the source/drain epitaxial layer 50 satisfies $$a < L < a + 2\sqrt{\left(\frac{a}{2}\right)^2 + (Y)^2}.$$

Figure 27:
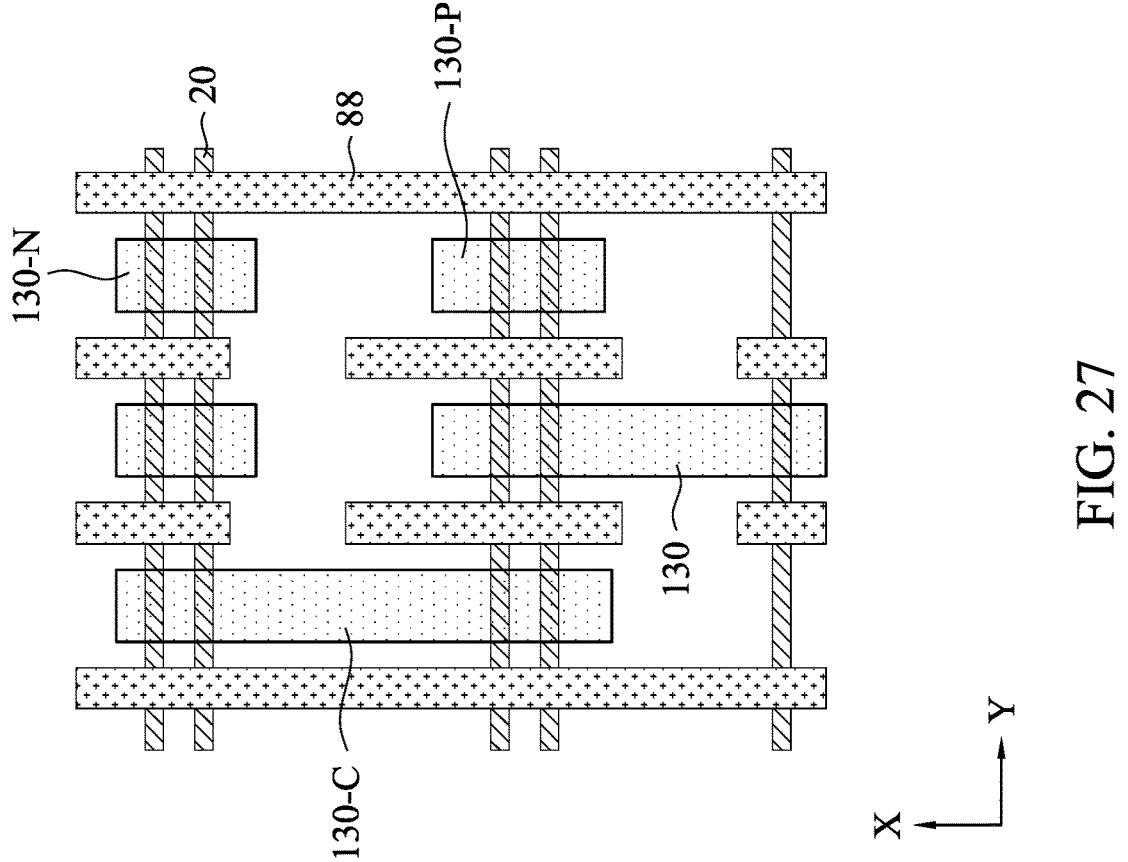
FIG. 27 shows a layout of a semiconductor device according to an embodiment of the present disclosure.

FIG. 27 shows a layout of some layers according to an embodiment of the present disclosure. FIG. 27 shows layout patterns for the fin structures 20, the gate electrodes 88 and source/drain contact 130. In some embodiments, the source/drain contact 130-N corresponds to the source/drain contact formed over the n-type epitaxial layer 50N, and the source/drain contact 130-P corresponds to the source/drain contact formed over the p-type epitaxial layer 50P, as shown in FIG. 21A. In some embodiments, the source/drain contact 130-C corresponds to the source/drain contact formed over the n-type epitaxial layer 50N and the p-type epitaxial layer 50P as shown in FIG. 25.

Figure 28:
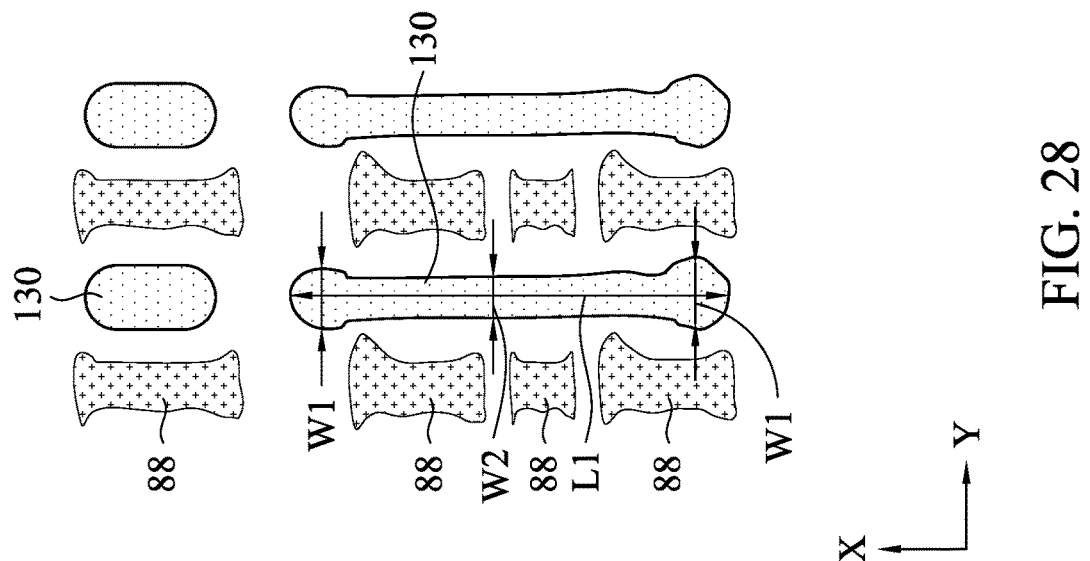
FIG. 28 shows a plan view of a semiconductor device according to an embodiment of the present disclosure.

FIG. 28 shows a plan view of the gate electrodes 88 and the source/drain contact 130. In some embodiments, one or more source/drain contact 130 is a long contact disposed over and connecting, for example, two or more two source/ drain epitaxial layers. In some embodiments, when the length L1 of the source/drain contact 130 is about 50 nm or more (less than about 500 nm), the source/drain contact 130 has a dumbbell shape or a dual hammer head shape having end portions wider than the center portion between the end portions. In some embodiments, the source/drain contact 130-C of FIG. 27 has such a long length. The width W1 of the end portions is about 0.5 nm to about 2 nm greater than the width W2 of the body center portion in some embodiments. This is achieved by adding a mask bias and/or assisting features to the original mask pattern for the source/ drain contact hole 100. The narrower center portion can avoid a short circuit failure between the gate electrode 88 and the source/drain contact 130. When the length L1 of the source/drain contact 130 is smaller than 50 nm, the width (measured at the center thereof) is substantially equal to W1 (difference is less than 2 nm).

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, an n-type source/drain epitaxial layer and a p-type source/drain epitaxial layer respectively formed, a dielectric layer is formed over the n-type source/drain epitaxial layer and the p-type source/drain epitaxial layer, a first opening is formed in the dielectric layer to expose a part of the n-type source/ drain epitaxial layer and a second opening is formed in the dielectric layer to expose a part of the p-type source/drain epitaxial layer, and the n-type source/drain epitaxial layer and the p-type source/drain epitaxial layer respectively recessed. A recessing amount of the n-type source/drain epitaxial layer is different from a recessing amount of the p-type source/drain epitaxial layer. In one or more of the foregoing and following embodiments, the recessing amount of the n-type source/drain epitaxial layer is greater than the recessing amount of the p-type source/drain epitaxial layer. In one or more of the foregoing and following embodiments, a difference between the recessing amount of the n-type source/drain epitaxial layer and the recessing amount of the p-type source/drain epitaxial layer is more than 1 nm. In one or more of the foregoing and following embodiments, the recessing amount of the n-type source/drain epitaxial layer is in a range from 11 nm to 18 nm. In one or more of the foregoing and following embodiments, the recessing amount of the p-type source/drain epitaxial layer is in a range from 7 nm to 12 nm. In one or more of the foregoing and following embodiments, the n-type source/drain epitaxial layer includes a SiP layer, and the p-type source/drain epitaxial layer includes a SiGe layer, and the recessing the n-type source/drain epitaxial layer and the p-type source/ drain epitaxial layer comprises plasma etching using a gas containing sulfur. In one or more of the foregoing and following embodiments, the gas containing sulfur is at least one of COS or $SF_6$. In one or more of the foregoing and following embodiments, the first opening is discontinuous from the second opening. In one or more of the foregoing and following embodiments, the first opening and the second opening form a continuous opening.

In accordance with another aspect of the present disclosure, in a method of manufacturing a semiconductor device, an n-type source/drain epitaxial layer is formed over one or more first fin structures and a p-type source/drain epitaxial layer is formed over one or more second fin structures, a dielectric layer is formed over the n-type source/drain epitaxial layer and the p-type source/drain epitaxial layer, a first opening is formed in the dielectric layer to expose a part of the n-type source/drain epitaxial layer and a second opening is formed in the dielectric layer to expose a part of the p-type source/drain epitaxial layer, the n-type source/drain epitaxial layer and the p-type source/drain epitaxial layer respectively recessed, and a first source/drain contact is formed over the recessed n-type source/drain epitaxial layer, and a second source/drain contact is formed over the recessed p-type source/drain epitaxial layer. A recessing amount of the n-type source/drain epitaxial layer is greater than a recessing amount of the p-type source/drain epitaxial layer. In one or more of the foregoing and following embodiments, a first silicide layer is formed on the recessed n-type source/drain epitaxial layer and a second silicide layer is formed on the recessed p-type source/drain epitaxial layer, before the first and second source/drain contacts are formed. In one or more of the foregoing and following embodiments, the n-type source/drain epitaxial layer includes a SiP layer, and the p-type source/drain epitaxial layer includes a SiGe layer, and the recessing the n-type source/drain epitaxial layer and the p-type source/drain epitaxial layer comprises plasma etching at the same time using a gas containing sulfur. In one or more of the foregoing and following embodiments, the gas containing sulfur is at least one of COS or $SF_6$. In one or more of the foregoing and following embodiments, a difference between the recessing amount of the n-type source/ drain epitaxial layer and the recessing amount of the p-type source/drain epitaxial layer is in a range from 2 nm to 6 nm. In one or more of the foregoing and following embodiments, the recessing amount of the n-type source/drain epitaxial layer is in a range from 12 nm to 15 nm. In one or more of the foregoing and following embodiments, the recessing amount of the p-type source/drain epitaxial layer is in a range from 8 nm to 10 nm. In one or more of the foregoing and following embodiments, before the recessing the n-type source/drain epitaxial layer and the p-type source/drain epitaxial layer, an insulating liner layer is formed on an inner sidewall of the first and second openings and on the n-type source/drain epitaxial layer and the p-type source/drain epitaxial layer, respectively, and a part of the insulating layer formed on the n-type source/drain epitaxial layer and the p-type source/drain epitaxial layer is removed.

In accordance with another aspect of the present disclosure, in a method of manufacturing a semiconductor device, an n-type source/drain epitaxial layer and a p-type source/ drain epitaxial layer are formed, a dielectric layer is formed over the n-type source/drain epitaxial layer and the p-type source/drain epitaxial layer, an opening is formed in the dielectric layer to expose a part of the n-type source/drain epitaxial layer and a part of the p-type source/drain epitaxial layer, the n-type source/drain epitaxial layer and the p-type source/drain epitaxial layer respectively recessed, and a source/drain contact is formed over the recessed n-type source/drain epitaxial layer and the recessed p-type source/ drain epitaxial layer. A recessing amount of the n-type source/drain epitaxial layer is greater than a recessing amount of the p-type source/drain epitaxial layer. In one or more of the foregoing and following embodiments, a length of the source/drain contact is more than 50 nm, and the source/drain contact has a dumbbell shape in plan view. In one or more of the foregoing and following embodiments, the n-type source/drain epitaxial layer includes a SiP layer, and the p-type source/drain epitaxial layer includes a SiGe layer, and the recessing the n-type source/drain epitaxial layer and the p-type source/drain epitaxial layer comprises plasma etching at the same time using at least one gas of COS or SF$_6$, and one or more gases of fluorocarbon, H2, O2, Ar or N2.

In accordance with another aspect of the present disclosure, a semiconductor device includes an n-type field effect transistor including an n-type source/drain epitaxial layer, and a p-type field effect transistor including a p-type source/drain epitaxial layer. A difference in height of the n-type source/drain epitaxial layer and the p-type source/drain epitaxial layer is more than 1 nm. In one or more of the foregoing and following embodiments, the semiconductor device further includes a source/drain contact disposed over the n-type source/drain epitaxial layer and the p-type source/drain epitaxial layer. A length of the source/drain contact is more than 50 nm. In one or more of the foregoing and following embodiments, the source/drain contact has a dumbbell shape in plan view. In one or more of the foregoing and following embodiments, the dumbbell shape includes end portions having a width W1 and a center portion having a width W2 between the end portions, and a difference W1−W2 is in a range from 0.5 nm to 2 nm. In one or more of the foregoing and following embodiments, the difference in height of the n-type source/drain epitaxial layer and the p-type source/drain epitaxial layer is in a range from 2 nm to 6 nm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

forming an n-type source/drain epitaxial layer and a p-type source/drain epitaxial layer, respectively;

forming a dielectric layer over the n-type source/drain epitaxial layer and the p-type source/drain epitaxial layer;

forming a first opening in the dielectric layer to expose a part of the n-type source/drain epitaxial layer and a second opening in the dielectric layer to expose a part of the p-type source/drain epitaxial layer;

recessing the n-type source/drain epitaxial layer and the p-type source/drain epitaxial layer, respectively; and forming at least one elongate source/drain contact spanning and connecting two or more source/drain epitaxial layers, the at least one elongate source/drain contact having a dumbbell shape in a plan view with end portions having a greater width than a center portion located between the end portions, wherein a recessing amount of the n-type source/drain epitaxial layer is different from a recessing amount of the p-type source/drain epitaxial layer.

2. The method of claim 1, wherein the recessing amount of the n-type source/drain epitaxial layer is greater than the recessing amount of the p-type source/drain epitaxial layer.

3. The method of claim 2, wherein a difference between the recessing amount of the n-type source/drain epitaxial layer and the recessing amount of the p-type source/drain epitaxial layer is more than 1 nm.

4. The method of claim 2, wherein the recessing amount of the n-type source/drain epitaxial layer is in a range from 11 nm to 18 nm.

5. The method of claim 2, wherein the recessing amount of the p-type source/drain epitaxial layer is in a range from 7 nm to 12 nm.

6. The method of claim 2, wherein:

the n-type source/drain epitaxial layer includes a SiP layer, and the p-type source/drain epitaxial layer includes a SiGe layer, and the recessing the n-type source/drain epitaxial layer and the p-type source/drain epitaxial layer comprises plasma etching using a gas containing sulfur.

7. The method of claim 6, wherein the gas containing sulfur is at least one of COS or SF$_6$.

8. The method of claim 1, wherein the first opening is discontinuous from the second opening.

9. The method of claim 1, wherein the first opening and the second opening form a continuous opening.

10. The method of claim 1, wherein the end portions of the at least one elongate source/drain contact have a width 0.5 nm to 2 nm greater than a width of the center portion.

11. A method of manufacturing a semiconductor device, comprising:

forming an n-type source/drain epitaxial layer over one or more first fin structures and a p-type source/drain epitaxial layer over one or more second fin structures;

forming a dielectric layer over the n-type source/drain epitaxial layer and the p-type source/drain epitaxial layer;

forming a first opening in the dielectric layer to expose a part of the n-type source/drain epitaxial layer and a second opening in the dielectric layer to expose a part of the p-type source/drain epitaxial layer;

recessing the n-type source/drain epitaxial layer and the p-type source/drain epitaxial layer, respectively; and forming a first source/drain contact over the recessed n-type source/drain epitaxial layer, and a second source/drain contact over the recessed p-type source/drain epitaxial layer, wherein after the recessing, a top of the n-type source/drain epitaxial layer is lower than a top of the p-type source/drain epitaxial layer, wherein at least one of the first source/drain contact and the second source/drain contact is a dual hammer head shape in a plan view, the dual hammer head shape having end portions that are wider than a center portion between the end portions, and is disposed over and connects two or more source/drain epitaxial layers.

12. The method of claim 11, further comprising forming a first silicide layer on the recessed n-type source/drain epitaxial layer and a second silicide layer on the recessed p-type source/drain epitaxial layer, before the first and second source/drain contacts are formed.

13. The method of claim 12, wherein:

the n-type source/drain epitaxial layer includes a SiP layer, and the p-type source/drain epitaxial layer includes a SiGe layer, and the recessing the n-type source/drain epitaxial layer and the p-type source/drain epitaxial layer comprises plasma etching at the same time using a gas containing sulfur.

14. The method of claim 13, wherein the gas containing sulfur is at least one of COS or SF$_6$.

15. The method of claim 11, wherein a difference between a recessing amount of the n-type source/drain epitaxial layer and a recessing amount of the p-type source/drain epitaxial layer is in a range from 2 nm to 6 nm.

16. The method of claim 11, wherein a recessing amount of the n-type source/drain epitaxial layer is in a range from 12 nm to 15 nm.

17. The method of claim 11, wherein a recessing amount of the p-type source/drain epitaxial layer is in a range from 8 nm to 10 nm.

18. The method of claim 11, further comprising, before the recessing the n-type source/drain epitaxial layer and the p-type source/drain epitaxial layer:

forming an insulating liner layer on an inner sidewall of the first and second openings and on the n-type source/ drain epitaxial layer and the p-type source/drain epitaxial layer, respectively; and removing a part of the insulating liner layer formed on the n-type source/drain epitaxial layer and the p-type source/drain epitaxial layer.

19. A method of manufacturing a semiconductor device, comprising:

forming an n-type source/drain epitaxial layer and a p-type source/drain epitaxial layer;

forming a dielectric layer over the n-type source/drain epitaxial layer and the p-type source/drain epitaxial layer;

forming an opening in the dielectric layer to expose a part of the n-type source/drain epitaxial layer and a part of the p-type source/drain epitaxial layer;

recessing the n-type source/drain epitaxial layer;

recessing the p-type source/drain epitaxial layer; and forming a source/drain contact over the recessed n-type source/drain epitaxial layer and the recessed p-type source/drain epitaxial layer, wherein a recessing amount of the n-type source/drain epitaxial layer is greater than a recessing amount of the p-type source/drain epitaxial layer, wherein a length of the source/drain contact is more than 50 nm, and wherein the source/drain contact has a dumbbell shape in plan view.

20. The method of claim 19, wherein:

the n-type source/drain epitaxial layer includes a SiP layer, and the p-type source/drain epitaxial layer includes a SiGe layer, and the recessing the n-type source/drain epitaxial layer and the p-type source/drain epitaxial layer occur at a same time by plasma etching using an etching source gas including at least one gas of COS or $SF_6$, and one or more gases of fluorocarbon, $H_2$, $O_2$, Ar or $N_2$.

* * * * *